United States Patent [19]
Tanioka et al.

[11] Patent Number: 5,668,058
[45] Date of Patent: Sep. 16, 1997

[54] METHOD OF PRODUCING A FLIP CHIP

[75] Inventors: Michinobu Tanioka; Motoji Suzuki, both of Tokyo, Japan

[73] Assignee: NEC Corporation, Tokyo, Japan

[21] Appl. No.: 580,152

[22] Filed: Dec. 28, 1995

[51] Int. Cl.$^6$ .................................................. H01L 21/60
[52] U.S. Cl. ........................... 438/108; 438/119; 438/613
[58] Field of Search ............................... 437/183, 209, 437/210, 214, 215, 216, 217, 220; 228/180.1, 180.21, 180.22, 207, 214, 904

[56] References Cited

U.S. PATENT DOCUMENTS

| | | | |
|---|---|---|---|
| 4,818,728 | 4/1989 | Rai et al. | 228/180.1 |
| 5,014,111 | 5/1991 | Tsuda et al. | 437/183 |
| 5,111,991 | 5/1992 | Clawson et al. | 228/180.1 |
| 5,118,029 | 6/1992 | Fuse et al. | 228/180.22 |
| 5,143,865 | 9/1992 | Hideshima | 437/183 |
| 5,164,022 | 11/1992 | Pine et al. | 148/23 |
| 5,259,546 | 11/1993 | Volk | 228/180.1 |
| 5,290,732 | 3/1994 | Kumar et al. | 437/183 |
| 5,296,649 | 3/1994 | Kosuga et al. | 228/180.1 |
| 5,439,162 | 8/1995 | George et al. | 228/180.22 |
| 5,451,274 | 9/1995 | Gupta | 437/183 |

*Primary Examiner*—Kevin Picardat
*Attorney, Agent, or Firm*—Whitham, Curtis, Whitham & McGinn

[57] ABSTRACT

A flux is applied to a circuit board on which solder is deposited beforehand. Then, the circuit board is subjected to reflow and then to rinsing. After the rinsing, an IC chip 1 having metal bumps on its electrodes, is mounted to the circuit board. Before the mounting, the chip 1 and circuit board are heated in an inactive gas atmosphere having a low oxygen concentration. At the time of mounting, the solder is melted at a temperature higher than its melting point so as to connect the chip 1 to the circuit board.

24 Claims, 5 Drawing Sheets

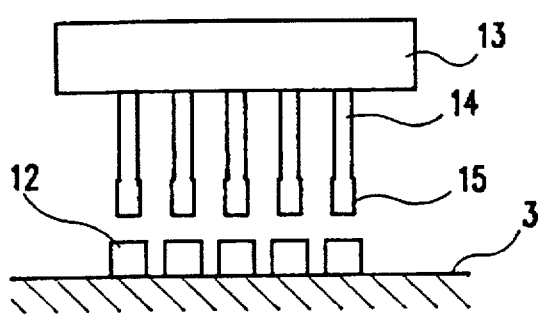
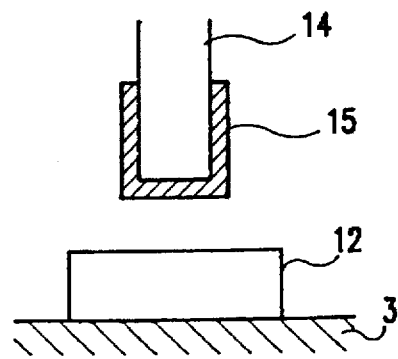
FIG.8A  FIG.9A
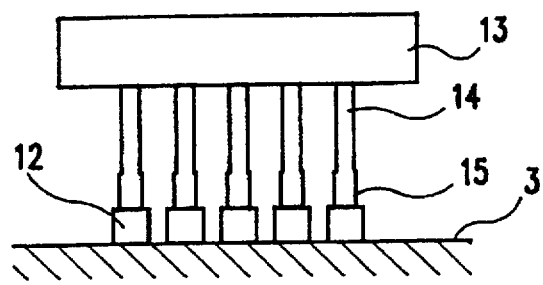
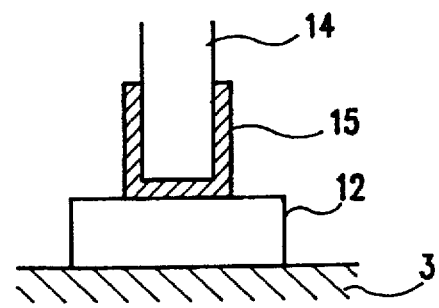
FIG.8B  FIG.9B
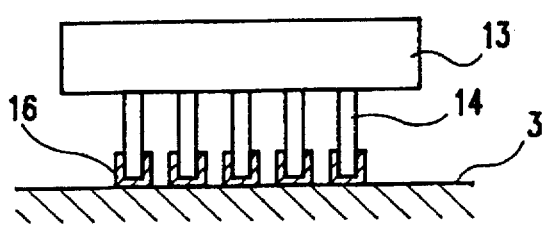
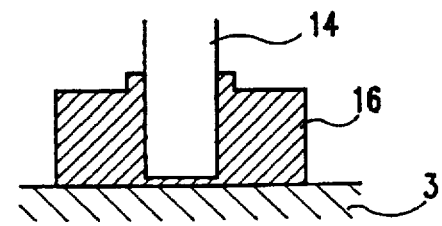
FIG.8C  FIG.9C
PRIOR ART  PRIOR ART

METHOD OF PRODUCING A FLIP CHIP

BACKGROUND OF THE INVENTION

1. Field of the Invention

The present invention relates to a method of producing a flip chip and, more particularly, to a method of producing a flip chip by soldering.

2. Description of the Related Art

It is common practice to solder electronic parts by heating a flux applied thereto. This kind of soldering method is taught in, e.g., Japanese Patent Laid-Open Publication No. 3-050789 (JP-A-03-050789) or Japanese Patent Publication No. 64-001233 (JP-B2-64-001233). However, the problem with the soldering method using a flux is that an electronic part device must be rinsed after mounting because the flux is applied to the surface of the device to be soldered. This causes loads to act on portions where the device and a circuit board are connected, resulting in a defective product.

There is also available a soldering method not using a flux. This method positions pins studded on a presoldered LSI (Large Scale Integrated circuit) on solder bumps formed on a circuit board, and then heats them in an inactive atmosphere. In the inactive atmosphere, the oxide films of the solder bumps are broken by the weight of the package, forming soldered portions. While the presoldered films are formed by rinsing after the application of the flux, they do not matter at all because the flux can be removed before soldering. Such a fluxless soldering method is disclosed in, e.g., Japanese Patent Laid-Open Publication No. 3-106564 (JP-A-03-106564). However, because the pins are studded on the package, it is difficult to mount bare chip electrodes at a pitch as narrow as 120 μm to 170 μm by the above conventional method. Moreover, because the oxide films of the solder bumps are broken by the weight of the package, the method cannot fully break the oxide films when it comes to relatively small packages, bare chips or similar relatively light electronic parts.

SUMMARY OF THE INVENTION

It is therefore an object of the present invention to provide a soldering method free from the above problems particular to the conventional methods.

It is another object of the present invention to provide a soldering method capable of enhancing yield and reliability.

It is another object of the present invention to provide a method of producing a flip chip by using the above soldering method.

In accordance with the present invention, a method of producing a flip chip has the steps of applying a flux to a circuit board to which solder is fed beforehand, causing the flux to reflow, rinsing the circuit board after the reflow, mounting a part having metal bumps on its electrodes to the circuit board, and melting the solder by heating the solder at a preselected temperature higher than the melting point of the solder in an inactive atmosphere having a low oxygen concentration. Preferably, the low oxygen concentration is less than 4.5% inclusive. The preselected temperature may advantageously be 1° C. to 20° C. higher than the melting point. To produce the inactive atmosphere, nitrogen gas may be blown.

The circuit board and the IC chip may desirably be heated to a preselected temperature beforehand.

Also, in accordance with the present invention, a method of producing a flip chip has the steps of applying a flux to a circuit board to which solder is fed beforehand, causing the flux to reflow, rinsing the circuit board after the reflow, and melting, when an IC chip having metal bumps on its electrodes is mounted to the circuit board, the solder at a temperature higher than the melting point of the solder in an inactive atmosphere having a low oxygen concentration, and causing the pressure to rise to a preselected pressure.

Further, in accordance with the present invention, a method of soldering an electronic part has the steps of applying a flux to a circuit board to which solder is fed beforehand, causing the flux to reflow, rinsing the circuit board after the reflow, mounting an electronic part having metal bumps on electrodes thereof to the circuit board, and melting the solder by heating the solder at a preselected temperature higher than the melting point of the solder in an inactive atmosphere having a low oxygen concentration.

BRIEF DESCRIPTION OF THE DRAWINGS

These and other objects, features and advantages of the present invention will become more fully apparent from the following detailed description taken with the accompanying drawings in which:

FIGS. 8(A)–8(C) are sections representative of a further conventional soldering method;

FIGS. 9(A)–9(C) are sections showing connecting portions of FIGS. 8(A)–8(C), respectively;

FIGS. 10(a)–10(D) are sections showing a flip chip producing method embodying the present invention;

In the drawings, the same reference numerals denote the same structural elements.

DESCRIPTION OF THE PREFERRED EMBODIMENT

To facilitate an understanding of the present invention, a brief reference will be made to prior art methods for the production of flip chip.

Figure 1:
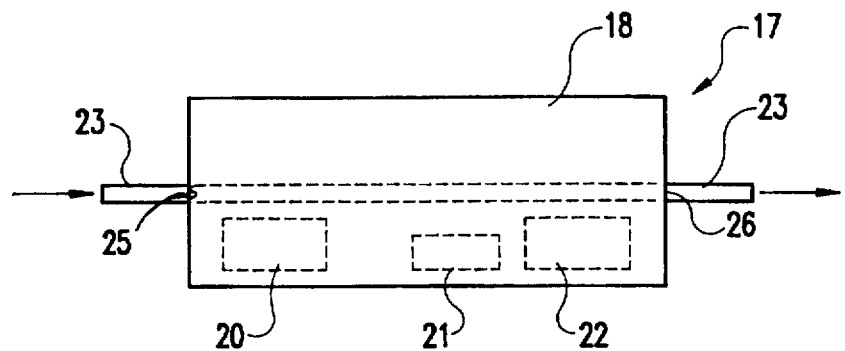
FIG. 1 is a plan view showing a conventional soldering apparatus.
Figure 2:
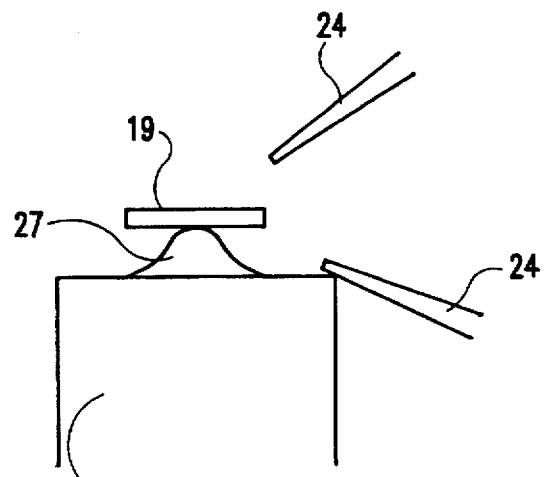
FIG. 2 is a sectional view of a solder vessel included in the apparatus of FIG. 1.
Figure 3:
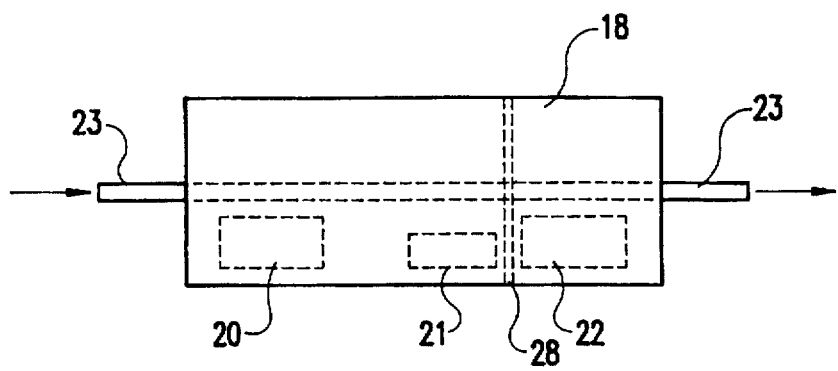
FIG. 3 is a plan view of the apparatus of FIG. 1 to which a partition is added.
Figure 4:
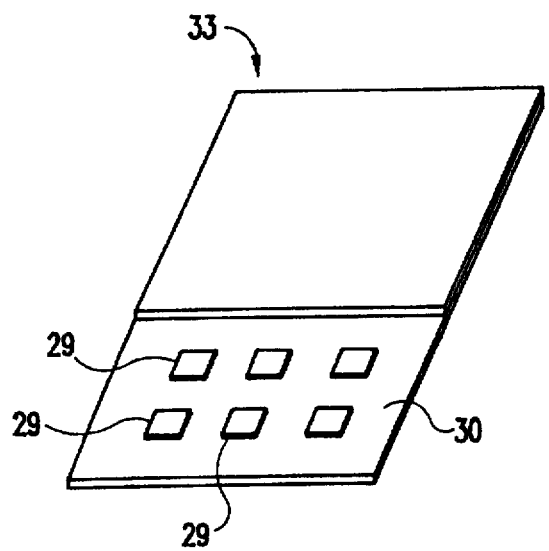
FIG. 4 is a perspective view of electronic parts to be dealt with by another conventional soldering method.
Figure 7:
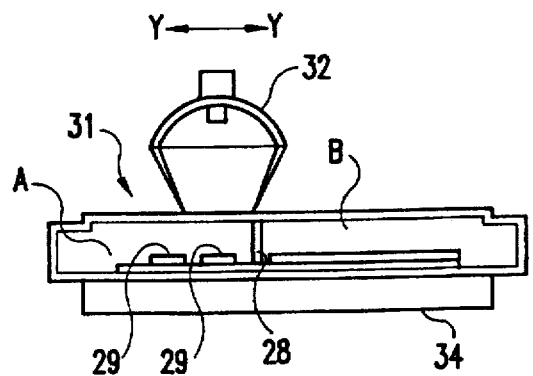
FIG. 7 is a side elevation of the apparatus shown in FIG. 6.
Figure 5:
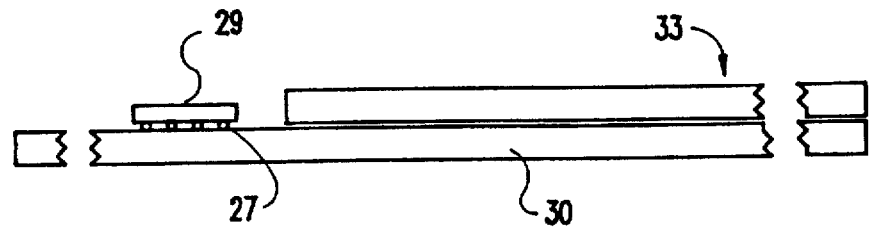
FIG. 5 is a side elevation of one of the electronic parts shown in FIG. 4.
Figure 6:
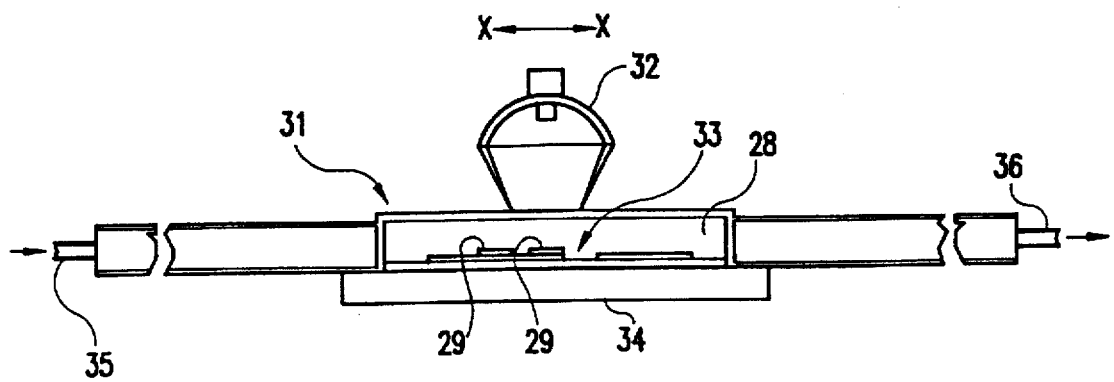
FIG. 6 is a front view of a soldering apparatus for soldering the electronic parts of FIG. 4.

Referring to FIGS. 1–3, a soldering method taught in previously mentioned JP-A-03-050789 is shown. As shown, a soldering apparatus 17 has a casing 18 defining a hermetically closed space therein. A fluxer 20, a heater 21 and a solder vessel 22 are sequentially arranged in order in a direction in which an electronic part device 19 is conveyed by a conveyor 23. The casing 18 is formed with an inlet 25 and an outlet 26. Means 24 for supplying $N_2$ or similar nonoxidizable fluid are located at a predetermined position in the casing 1. When the electronic part device 19 is introduced into the casing 18, the fluxer 20 applies a flux to the device 19 in the nonoxidizable atmosphere. Then, the heater 21 preheats the device 19 and flux. Subsequently, solder 27 is applied to the device 19 in the solder vessel 22. A partition 28 maintains the nonoxidizable atmosphere only in the space where the vessel 22 is positioned.

The problem with the above soldering method is that the device 19 must be rinsed after mounting because the flux is applied to the surface of the device 19 to be soldered. Specifically, when this kind of method is applied to the production of flip chips, gaps formed between IC chips mounted on a circuit board (electronic part device) and the circuit board which cam be as narrow as 30 μm to 50 μm must be rinsed. This causes loads to act on portions where the IC chips and circuit board are connected, resulting in a defective product. Further, at the time of a humidity stress test or similar reliability test, ions of impurities left on the product bring about various defects, e.g., the corrosion of aluminum electrodes included in the IC chips, defective insulation, and migration.

FIGS. 4–7 show a soldering method disclosed in JP-B2-64-001233. As shown, solder 27 is deposited on the terminals of liquid crystal drive ICs 29 while a flux is applied to the terminals of a glass substrate 30. After the ICs 29 and substrate 30 have been positioned, they are temporarily bonded together. The ICs 29 are conveyed into a furnace 31. In the furnace 31, $N_2$ gas, for example, is fed from a gas inlet 35 while an infrared lamp 32 is turned on. As a result, the soldering portions are locally heated to thereby solder a liquid crystal module 33. A preheat plate 34 preheats the module 33. The gas entered via the inlet 35 flows out via a gas outlet 36.

The method shown in FIGS. 4–7 has the previously discussed problem because a flux is used to temporarily bond the ICs 29 with the solder to the glass substrate 30. In addition, because the soldering apparatus cannot handle two or more liquid crystal modules at a time and effects batch processing, it is expensive.

Referring to FIGS. 8(A)–8(C) and 9(A)–9(C), a soldering method proposed in JP-A-03-106564 will be described. As shown, In (indium) solder bumps 12 are provided on a circuit board 3. Pins 14 are studded on an LSI package 13, and each is provided with a Ga (gallium) film 15 beforehand. After the In solder bumps 12 and pins 14 have been brought into contact with each other, they are heated in an inactive atmosphere. At this instant, the oxide films of the In solder bumps 12 are broken by the weight of the package 13 at all the soldering portions. Consequently, the melted In and melted Ga are mixed together and form In-Ga soldered portions 16.

However, because the pins 14 are studded on the package 13, it is difficult to mount bare chip electrodes at a pitch as narrow as 120 μm to 170 μm by the above conventional method. Moreover, because the oxide films of the solder bumps 12 are broken by the weight of the package 13, the method cannot fully break the oxide films when it comes to relatively small packages, bare chips or similar relatively light electronic parts.

Figure 10C:
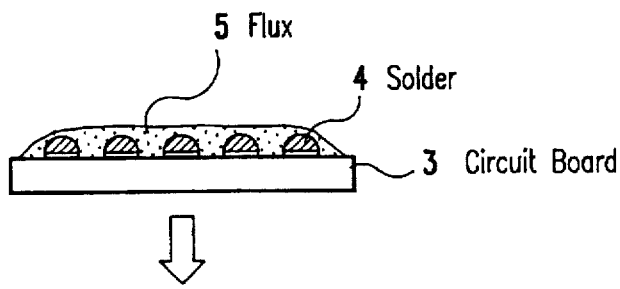
Figure 10C:
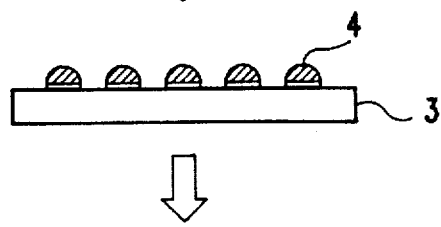
Figure 10C:
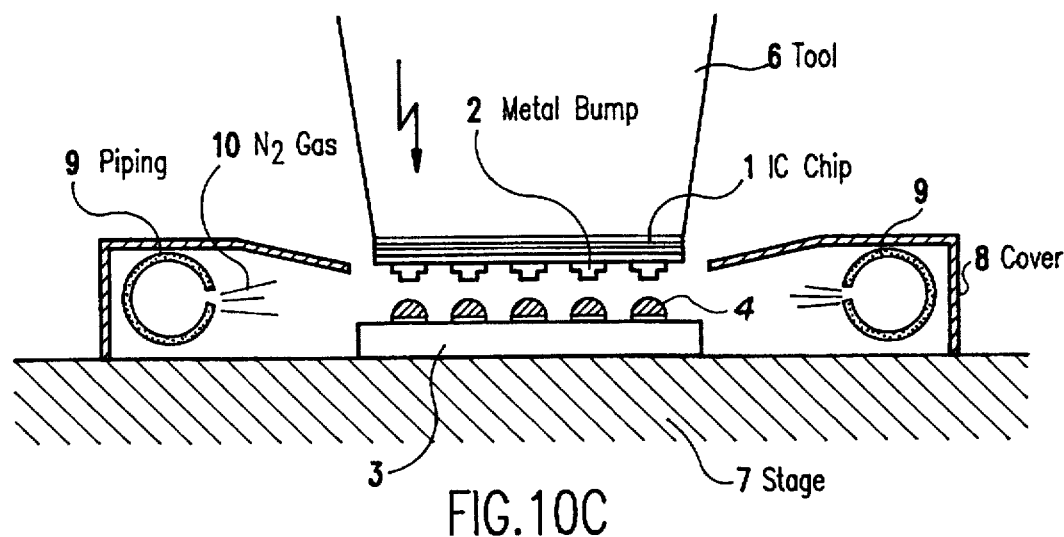

A reference will be made to FIGS. 10(A)–10(D), 11 and 12 for describing a flip chip producing method embodying the present invention. FIG. 10(A) shows a step to be performed first. As shown, solder 4 is provided on a circuit board 3. The circuit board 3 may be implemented as a printed circuit board, alumina substrate, glass ceramic substrate, or polyimide copper flexible substrate by way of example. The solder 4 may be comprised of Pb (lead)/Sn (tin), Ag (silver)/Sn, In/Sn, In/Sn/Pb, Bi (bismuth)/Sn/Pb by way of example. A flux 5 is applied to the circuit board 3 by dispensing or printing. The flux 5 should preferably be implemented by a solvent having a low impurity ion content, e.g., less than 100 ppm inclusive and a high boiling point; for example, use may be made of RM5041 or R5149 (trade name) available from Nihon Alphametals.

On the circuit board 3 carrying the flux 5, the solder 4 is melted by reflow. As a result, organic substances or oxide films are removed from the surface of the solder 4, so that a new or clean surface appears on the solder 4. For the there are available air reflow which heats and melts solder with convection heat generated by a hot air circulation system, IR reflow using heat radiated by a far-infrared ray system, or VPS reflow using a fluorine-based inactive solvent as a heat medium for soldering, and the condensation latent image of vapor produced at the saturation vapor pressure which is produced by evaporating the heat medium.

FIG. 10(B) shows a second step in which the circuit board 3 undergone the reflow is rinsed to fully remove the remaining flux. For this purpose, an optimal detergent is used. For example, when the previously mentioned RM5041 or R5149 is used as the flux 5, the detergent should preferably be implemented by EC-7R which is a mixture of a special surfactant and a component extracted from the skins of natural citrus fruits, and also available from Nihon Alphametals.

Preferably, after the remaining flux has been removed from the circuit board 3 by the detergent, the board 3 is rinsed by water. For example, the circuit board 3 may be rinsed for 5 minutes by the detergent, rinsed for 3 minutes by water (first water rinsing), again rinsed for 2 minutes by water (second water rinsing), and further rinsed for 2 minutes by water (third water rinsing). It is preferable that each water rinsing be effected by an ultrasonic wave, and that air blow be effected during the interval between the consecutive rinsing steps.

FIG. 10(C) shows a third step. As shown, an IC chip 1 is retained on the underside of a tool 6 by suction and has aluminum electrodes. Metal bumps 2 are formed on the aluminum electrodes of the chip 1. The metal bumps 2 should preferably be implemented by, e.g., Au (gold), Au/Pd (palladium), or Cu (cuprum). To form the metal bumps 2, it is preferable to use ball bonding which moves, after the first wire bonding, a capillary in X, Y and Z directions to thereby cut a wire. This kind of ball bonding is sometimes referred to as a stud bump method.

The circuit board 3 is mounted on a stage 7. A cover 8 and pipes 9 are arranged on the stage 7. Nitrogen gas is caused to flow through the pipes 9. An opening is formed through the top of the cover 8 and is great enough to accommodate the bottom portion of the tool 6. The stage 7 and tool 6 are heated beforehand, so that the chip 1 and circuit board 3 are preheated to a preselected temperature.

In the third step, the metal bumps 2 are brought into alignment with a wiring pattern provided on the circuit board 3 by image recognition, and then mounted to the circuit board 3. Then, the solder is fully melted at a temperature 1° C. to 20° C. higher than the melting point of the solder in an atmosphere whose oxygen concentration is less than about 4.5% inclusive. After a preselected pressure has been reached, it is held for 1 second to 20 second for the connection of the chip 1 to the circuit board 3.

Figure 10D:
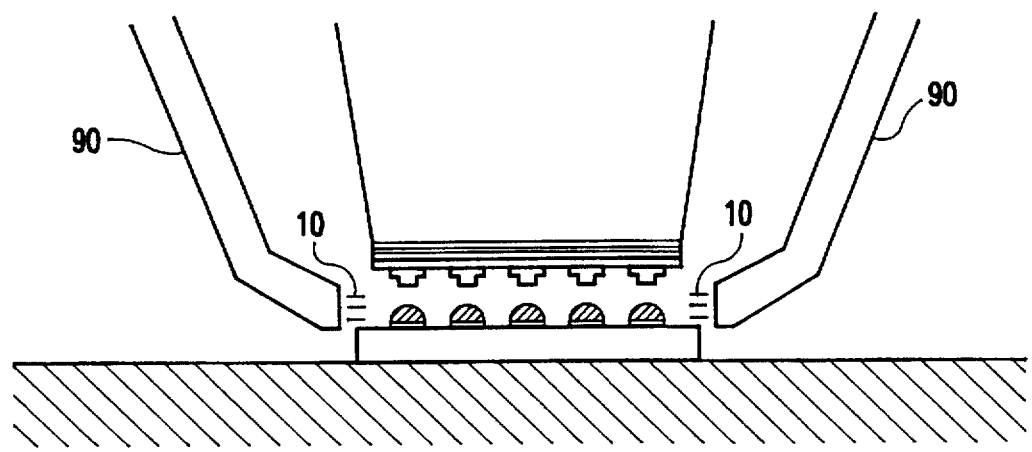

FIG. 10(D) shows an alternative third step. This step differs from the above third step in that use is made of a mounter having a jig 90 capable of blowing nitrogen gas from the sides of the tool 6.

Figure 11:
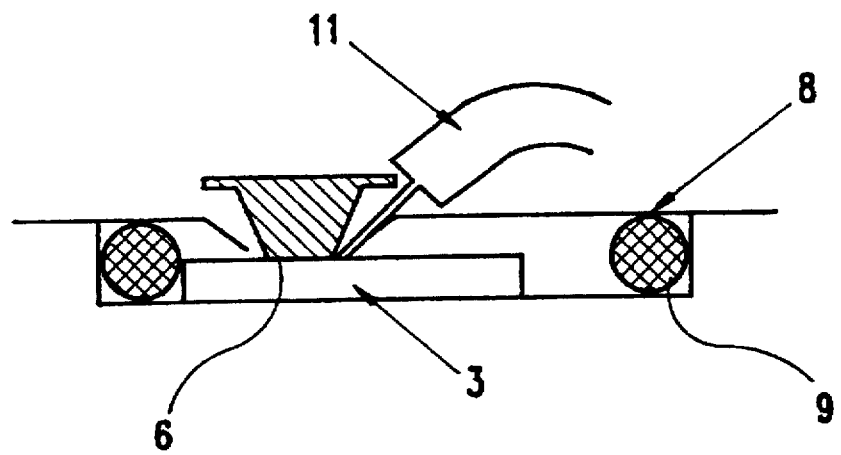
FIG. 11 is a section representation of a specific oxygen concentration measuring method applicable to the present invention.
Figure 12:
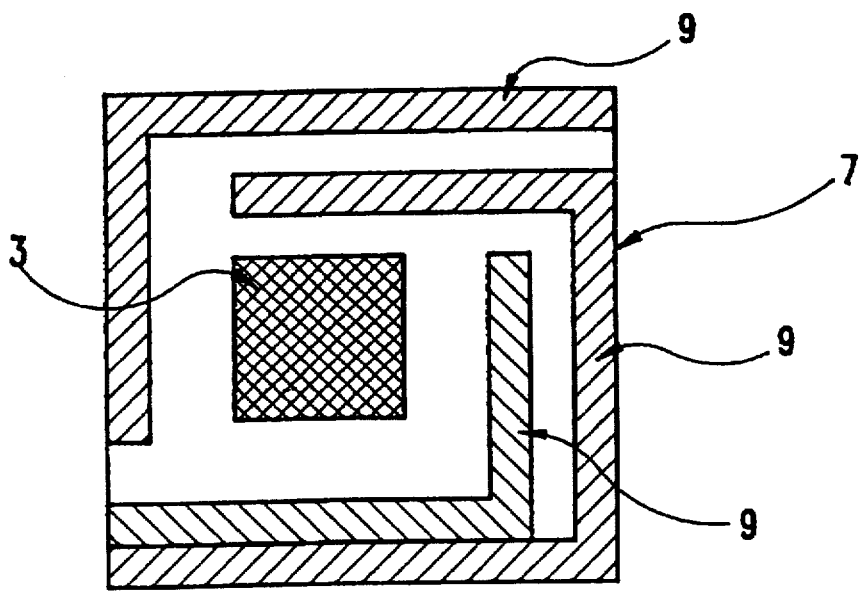
FIG. 12 shows a specific configuration for feeding $N_2$ (nitrogen dioxide) gas and applicable to the present invention.

FIGS. 11 and 12 show a specific arrangement for measuring the oxygen concentration. As shown, after the circuit board 3 and tool 6 have been actually set in the respective positions, the tips of nozzles 11 are each abutted against the center of one side where the circuit board 3 and tool 6 contact each other. The oxygen concentration is read ten times or so via the nozzles 11. The flow rate of the nitrogen gas is so adjusted as to set up an oxygen concentration lower than 4.5% inclusive in terms of mean value. Such a measuring method will also be used when the nitrogen gas is fed from the tool 6. For the measurement of oxygen concentration, TORAY LC-800 available from Toray is desirable. Preferably, the oxygen concentration should be sampled at a rate of once per second.

In summary, in accordance with the present invention, a substrate provided with solder beforehand is subjected to reflow and rinsing. After the surface of the solder has been rinsed, an IC chip having metal bumps is mounted to the substrate. At this instant, the solder is heated and melted in a fluxless nitrogen atmosphere having an oxygen concentration of less than about 4.5% inclusive, thereby connecting the IC chip to the substrate. This insures wettability and connection quality comparable with those attainable with a flux. Further, because no loads act on the portions where the IC chip and substrate are connected, the initial yield is increased. In addition, because remaining ions of impurities are fully removed, defects ascribable to a humidity test or similar reliability test are noticeably reduced.

While the invention has been described with reference to a specific embodiment thereof, it will be appreciated by those skilled in the art that numerous variations, modifications and embodiments are possible, and accordingly, all such variations, modifications and embodiments are to be regarded as being within the spirit and scope of the invention.

What is claimed is:

1. A method of producing a flip chip, comprising the steps of:

applying a flux to a circuit board to which solder is applied beforehand;

causing the flux to reflow;

rinsing the circuit board after the reflow;

mounting an integrated circuit (IC) chip having metal bumps on electrodes thereof to the circuit board;

melting the solder by heating the solder at a temperature higher than a melting point of the solder in an inactive atmosphere having an oxygen concentration; and maintaining said IC chip and said circuit board at a pressure for a time period.

2. A method as claimed in claim 1, wherein the oxygen concentration is less than 4.5% inclusive.

3. A method as claimed in claim 1, wherein the temperature is 1° C. to 20° C. higher than the melting point.

4. A method as claimed in claim 1, wherein the inactive atmosphere is produced by blowing nitrogen gas.

5. A method as claimed in claim 1, wherein the circuit board and the IC chip are heated to said temperature beforehand.

6. A method of producing a flip chip, comprising the steps of:

applying a flux to a circuit board to which solder is applied beforehand;

causing the flux to reflow;

rinsing the circuit board after the reflow; and melting, when an integrated circuit (IC) chip having metal bumps on electrodes thereof is mounted to the circuit board, the solder at a temperature higher than a melting point of the solder in an inactive atmosphere having an oxygen concentration, and maintaining said IC chip and said circuit board at a pressure for a time period.

7. A method as claimed in claim 6, wherein the solder comprises one of Pb/Sn, Ag/Sn, In/Sn, In/Sn/Pb, and Bi/Sn/Pb.

8. A method as claimed in claim 6, wherein the circuit board comprises one of a printed circuit board, an alumina substrate, a glass ceramic substrate, and polyimide copper flexible substrate.

9. A method as claimed in claim 6, wherein the reflow comprises air reflow for melting the solder by convection heat generated by a hot air circulation system.

10. A method as claimed in claim 6, wherein the reflow comprises IR reflow for melting the solder by heat radiated by a far-infrared ray system.

11. A method as claimed in claim 6, wherein the reflow comprises VPS reflow using a fluorine-based inactive solvent as a heat medium for soldering, and melting the solder by using condensation latent heat of vapor at a saturated vapor pressure which is produced by boiling the heat medium.

12. A method as claimed in claim 6, wherein the step of rinsing comprises rinsing using a detergent, and a plurality of rinsings using water and an ultrasonic wave.

13. A method as claimed in claim 12, wherein air blowing is effected between the consecutive rinsings.

14. A method as claimed in claim 6, wherein the atmosphere having the low oxygen concentration is produced by a supply of nitrogen gas.

15. A method as claimed in claim 6, wherein the oxygen concentration is less than 4.5% inclusive.

16. A method as claimed in claim 6, wherein the temperature is 1° C. to 20° C. higher than the melting point.

17. A method as claimed in claim 6, wherein the circuit board and the IC chip are heated to said temperature before mounting.

18. A method of soldering an electronic part, comprising the steps of:

applying a flux to a circuit board to which solder is applied beforehand;

causing the flux to reflow;

rinsing the circuit board after the reflow;

mounting an electronic part having metal bumps on electrodes thereof to the circuit board; and melting the solder by heating the solder at a temperature higher than a melting point of the solder in an inactive atmosphere having an oxygen concentration.

19. A method as claimed in claim 18, wherein the oxygen concentration is less than 4.5% inclusive.

20. A method as claimed in claim 18, wherein the temperature is 1° C. to 20° C. higher than the melting point.

21. A method as claimed in claim 18, wherein the inactive atmosphere is produced by blowing a nitrogen gas.

22. A method as claimed in claim 18, wherein the substrate and the electronic part are heated to said temperature before mounting.

23. A method as claimed claim 18, wherein the substrate comprises a circuit board.

24. A method as claimed in claim 18, wherein the electronic part comprises an IC chip.

* * * * *